(12) United States Patent
Allen et al.

(10) Patent No.: US 7,256,349 B2
(45) Date of Patent: Aug. 14, 2007

(54) TELECOMMUNICATIONS CABLE ENCLOSURE

(75) Inventors: William G. Allen, Austin, TX (US);
Shirley E. Ball, Cedar Park, TX (US);
Sidney J. Berglund, Round Rock, TX (US); Laszlo Markos, Round Rock, TX (US); Rutesh D. Parikh, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/916,332

(22) Filed: Aug. 11, 2004

(65) Prior Publication Data

US 2006/0034578 A1 Feb. 16, 2006

(51) Int. Cl.
*H02G 15/113* (2006.01)

(52) U.S. Cl. .............................. 174/92; 174/41; 174/60; 174/93

(58) Field of Classification Search ................ 174/92, 174/41, 60, 93; 385/135; 361/119; 439/411
See application file for complete search history.

(56) References Cited

U.S. PATENT DOCUMENTS

| 3,138,657 | A | 6/1964 | Wengen |
| 3,711,815 | A | 1/1973 | Pierce et al. |
| 4,958,903 | A | 9/1990 | Cobb et al. |
| 5,042,901 | A | 8/1991 | Merriken et al. |
| 5,247,135 | A | 9/1993 | Rebers et al. |
| 5,521,998 | A | 5/1996 | Walles et al. |
| 5,745,633 | A | 4/1998 | Giebel et al. |
| 5,778,122 | A | 7/1998 | Giebel et al. |
| 5,923,802 | A | 7/1999 | Giebel et al. |
| 6,067,395 | A | 5/2000 | Cairns et al. |
| 6,175,483 | B1 | 1/2001 | Matsubara |
| 6,269,214 | B1 | 7/2001 | Naudin et al. |
| 6,385,381 | B1 | 5/2002 | Janus et al. |
| 6,487,344 | B1 | 11/2002 | Naudin et al. |
| 6,579,014 | B2 | 6/2003 | Melton et al. |
| 6,648,520 | B2 | 11/2003 | McDonald et al. |
| 6,721,484 | B1 | 4/2004 | Blankenship et al. |
| 2003/0174996 | A1 | 9/2003 | Henschel et al. |

FOREIGN PATENT DOCUMENTS

| CH | 683646 A5 | 4/1994 |
| EP | 0 350 245 A2 | 1/1990 |
| EP | 0 399 766 A2 | 11/1990 |
| EP | 0 805 536 A1 | 11/1997 |
| EP | 1 260 843 A1 | 11/2002 |
| GB | 2 368 139 A | 4/2002 |
| WO | WO 00/65397 | 11/2000 |
| WO | WO 02/31560 A1 | 4/2002 |
| WO | WO 2004/034116 A1 | 4/2004 |
| WO | WO 2004/061511 A2 | 7/2004 |

*Primary Examiner*—Jinhee Lee
(74) *Attorney, Agent, or Firm*—Gregg H. Rosenblatt

(57) ABSTRACT

An enclosure for use with a telecommunication cable includes a housing for retaining spliced telecommunication lines. At least one of a plurality of connection devices is connected to one of the spliced telecommunication lines within the housing. A primary entrance in the housing allowing simultaneous access to each of the plurality of connection devices in the housing. An adaptor integrally formed in a wall of the housing allows access and extraction of one of the plurality of connection devices through the wall of the housing from an exterior of the housing.

15 Claims, 11 Drawing Sheets

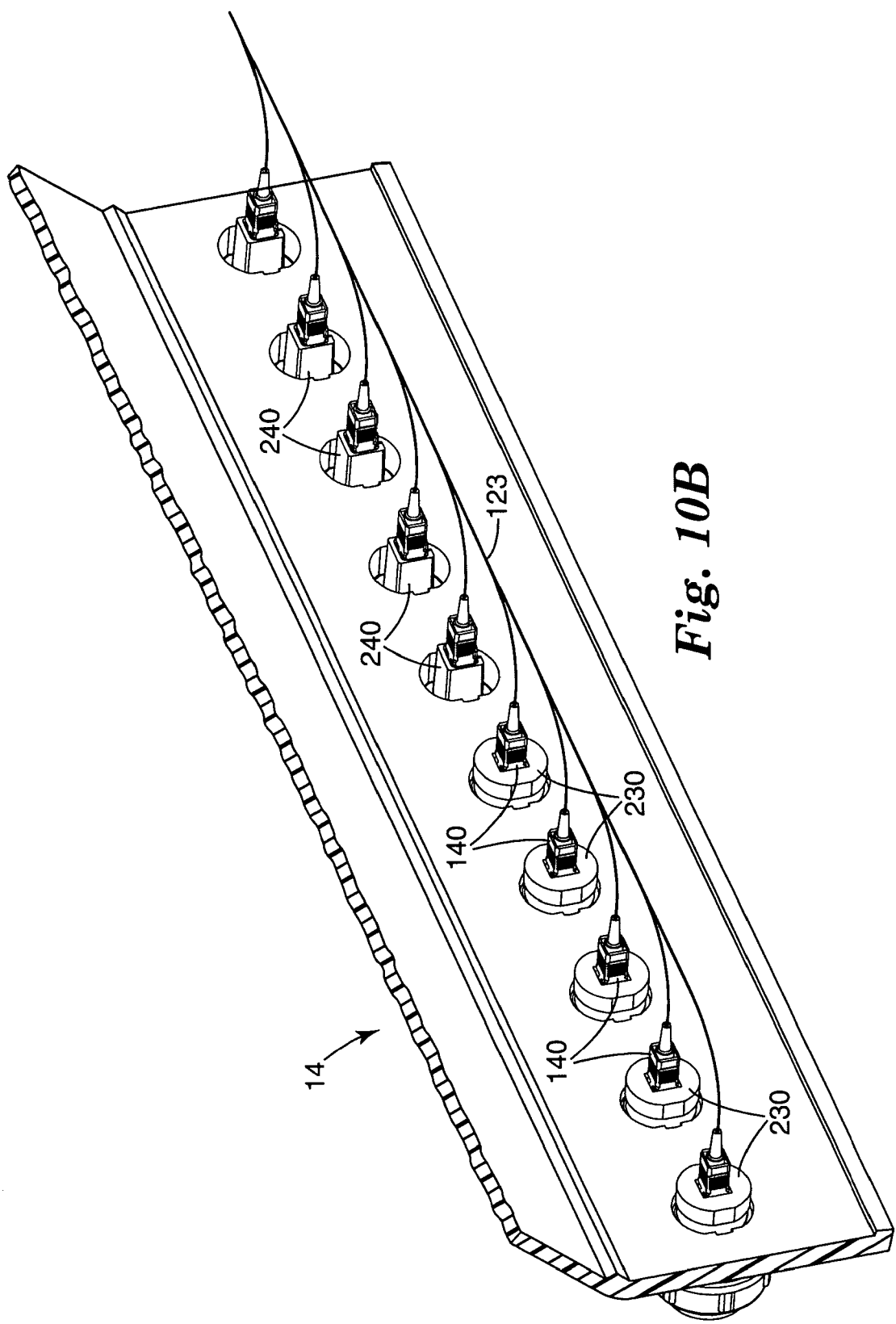

TELECOMMUNICATIONS CABLE ENCLOSURE

THE FIELD OF THE INVENTION

The present invention generally relates to enclosures for telecommunication cables. More particularly, the present invention relates to telecommunication enclosures configured to allow extraction of a connection device through a wall of the enclosure from the exterior of the enclosure.

BACKGROUND OF THE INVENTION

Telecommunication cables are ubiquitous and used for distributing all manner of data across vast networks. The majority of telecommunication cables are electrically conductive cables (typically copper), although the use of optical fiber cables is growing rapidly as larger and larger amounts of data are transmitted. As telecommunication cables are routed across networks, it is necessary to periodically open the cable and splice or tap into the cable so that data may be distributed to "branches" of the network. The branches may be further distributed until the network reaches individual homes, businesses, offices, and so on. The distributed lines are often referred to as drop lines or distribution lines. At each point where the cable is opened, it is necessary to provide some type of enclosure to protect the cable. Preferably, the enclosure allows easy and repeated access to the cable, such that technicians may easily access the cable to provide any necessary services.

Enclosures for both electrical and optical telecommunication cables are generally known. For example, enclosures that receive one or more cables and contain some form of cable connection (whether a splice, a connector, or other connection device) and surplus lengths of the cable are known. Such enclosures often also contain storage means for storing unused conductive wires or optical fibers waiting for subsequent use. In some enclosures, splices in the cable and connection devices intended for subsequent connection to drop wires or the like are maintained in separate areas of the enclosure, so as to reduce the possibility of damaging or disrupting cable splices during re-entry into the enclosure when connecting drop lines or the like. However, all of the drop line connections and their associated optical fibers or conductive wires are exposed when the enclosure is opened to connect new drop lines.

Much of the enclosure prior art is intended for use with electrically conductive telecommunications cables, and is not generally suitable for use with fiber optic cables which have different constructions and performance concerns than electrically conductive cables. For example, optical fibers used in fiber optic cables are susceptible to decreased performance or even breakage if they are bent beyond their minimum bend radius. Additionally, optical fibers and their connections (whether a splice, a connector, or other connection device) are more sensitive to their physical handling and the presence of debris such as dust, moisture, and the like. This sensitivity of optical fibers and their connection devices increases the likelihood of damaging the fibers or the connection devices, such as during reentry into the enclosure when connecting a drop line or the like.

Therefore, a telecommunications cable enclosure that allows the option to access one or a limited number of optical fiber connection devices in the enclosure during reentry, and does not require exposure of all optical fibers and connection devices in the enclosure, is highly desirable.

SUMMARY OF THE INVENTION

The invention described herein provides an enclosure for use with a telecommunications cable. In one embodiment according to the invention, the enclosure comprises a housing for retaining spliced telecommunication lines of a telecommunication cable therein. At least one of a plurality of connection devices is connected to one of the spliced telecommunication lines within the housing and configured for connection to a mating connection device terminating a telecommunication line extending outside of the housing. A primary entrance in the housing allowing simultaneous access to each of the plurality of connection devices in the housing, and an adaptor integrally formed in a wall of the housing allows access and extraction of one of the plurality of connection devices through the wall of the housing from an exterior of the housing.

In another embodiment according to the invention, the enclosure comprises a splice compartment for retaining splices in telecommunication lines and a terminal compartment for retaining telecommunication line connection devices apart from splices retained in the splice compartment. At least one port extends through a wall of the enclosure adjacent the terminal compartment. The at least one port is configured to receive a connection device and allow extraction of the connection device through the wall from outside the enclosure.

In another embodiment according to the invention, a terminal for a telecommunication cable comprises a splice closure for retaining spliced telecommunication lines of a telecommunication cable and a terminal closure joined to the splice closure. The terminal closure is configured to retain a plurality of connection devices connected to corresponding telecommunication lines in the splice closure. At least one closable port extends through an external wall of the terminal closure, the port configured for allowing a connection device to be withdrawn from the terminal closure through the port from an exterior of the terminal closure.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 10B is a perspective interior view of the enclosure of FIG. 10A.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. For example, FIGS. 1-5 and the associated detailed description illustrate a terminal 10 for use with an optical fiber cable. The terminal 10 of FIGS. 1-5 is only one exemplary embodiment of a telecommunication cable enclosure according to the invention, and is not intended to be exhaustive of all telecommunication cable enclosure embodiments according to the invention. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
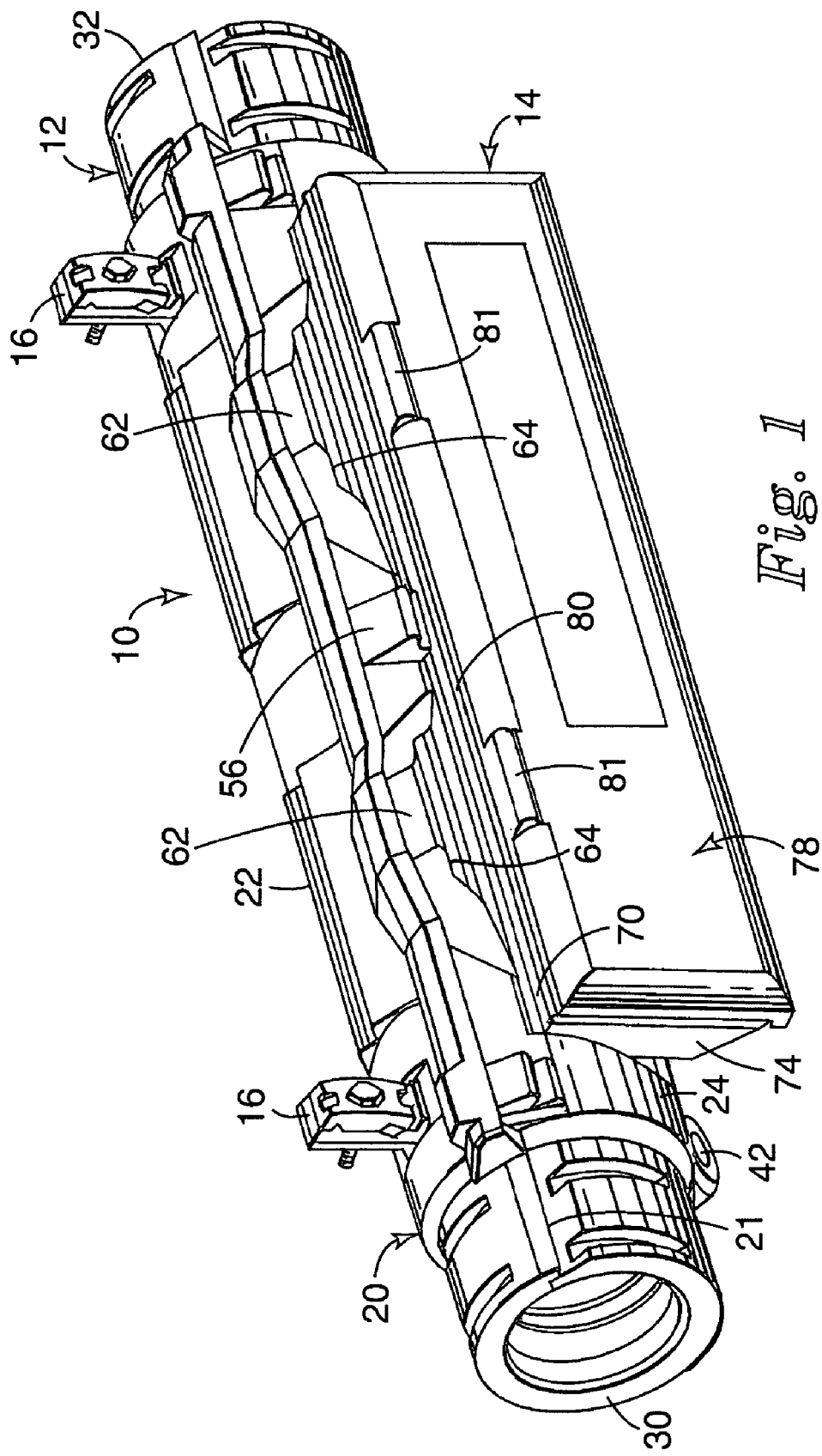
FIG. 1 is a perspective view of an embodiment of a telecommunications cable enclosure according to the invention.
Figure 2:
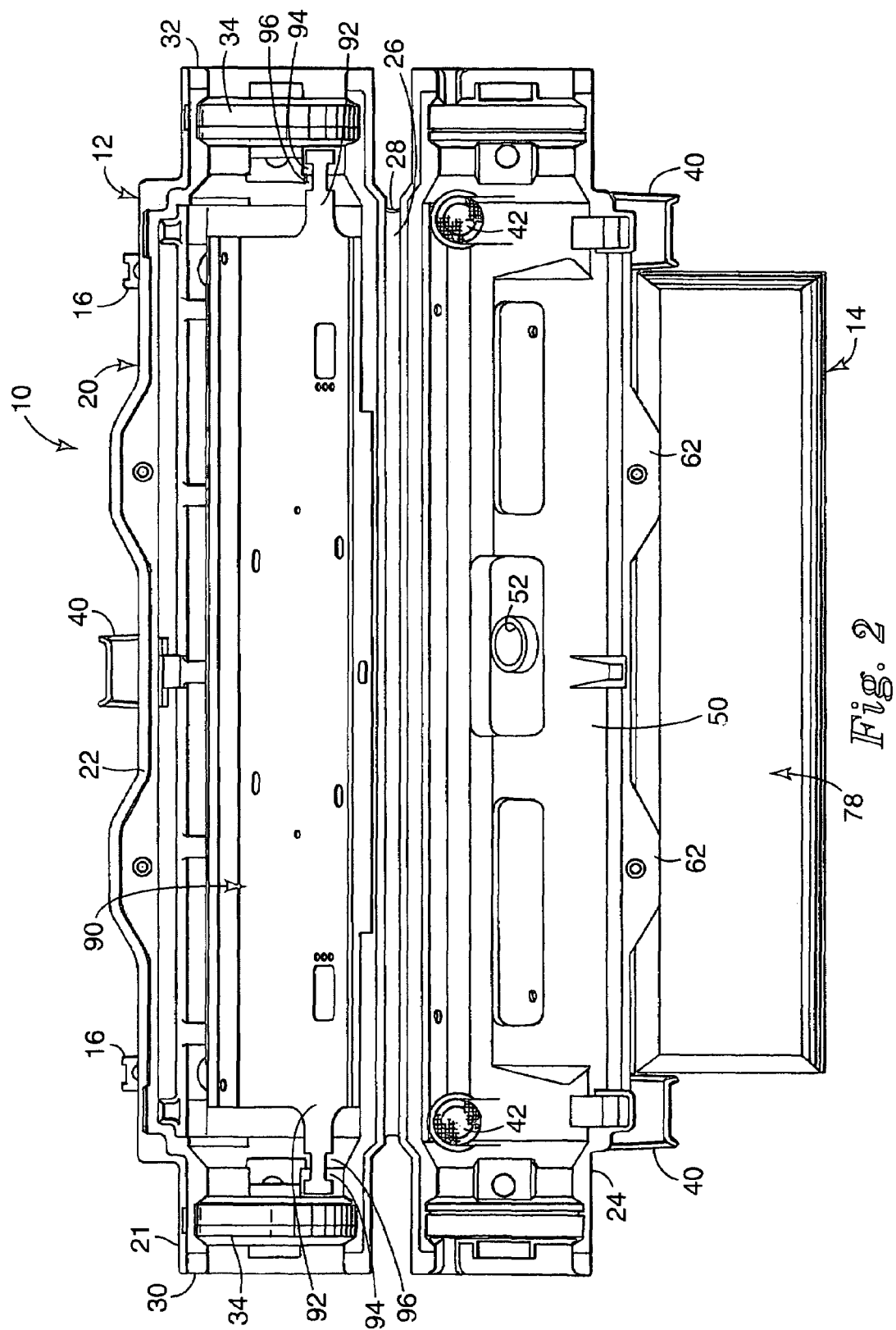
FIG. 2 is a side view of the enclosure of FIG. 1 showing the splice closure in an open position.

Referring to FIGS. 1 and 2, terminal 10 comprises an integral splice closure 12 and a terminal closure 14. As illustrated, terminal 10 is an above-grade (i.e., above-ground) enclosure, and is further adapted to be suspended from a support cable (not shown) by means of a pair of hangers 16. In other embodiments, terminal 10 may be a below-grade (i.e., below-ground) enclosure.

Splice closure 12 comprises a casing 20 which may be opened along an edge or opening seam 21, having mating ridges and grooves to form a labyrinth-type seal for restricting the ingress of dirt, water, bugs, and the like, into casing 20. Generally, casing 20 comprises first and second casing sections 22, 24 that are rotatably connected to one another along a hinge line 26. In one embodiment according to the invention, hinge line 26 is defined by a compression molded hinge 28. That is, hinge 28 is integral with casing sections 22, 24. Preferably, casing 20 is molded from a suitable polymer material, such as polyethylene or the like. In this manner, hinge 28 may be integrally formed with casing sections 22, 24 when casing 20 is molded. Casing 20 may be made by any conventional molding technique, such as blow molding, injection molding, and the like. Each section 22, 24 is approximately one half of casing 20. That is, each of sections 22, 24 is substantially semi-cylindrical in configuration.

As seen in FIG. 1, casing 20 has an elongated, substantially cylindrical shape with first and second opposite ends 30, 32. End seals 34 (best seen in FIG. 2) are disposed at first and second ends 30, 32 for receiving and sealing around cables (not shown) entering casing 20 at first and second ends 30, 32. The cylindrical casing 20 is maintained and secured in a closed condition by latch or fastening device 40. Fastening device 40 may be any of a variety of conventional arrangements whereby section 22 may be selectively secured to section 24 along seam 21. In the embodiment shown in FIGS. 1-5, fastening device 40 includes an actuator handle and securing latch forming a toggle latch. Fastening device 40 is supported on section 22 of casing 20 such that the latch portion of fastening device 40 may engage a boss 56 on section 24. Thus, casing 20 may be readily closed and opened, as desired, to provide access to an interior of casing 20.

Figure 4:
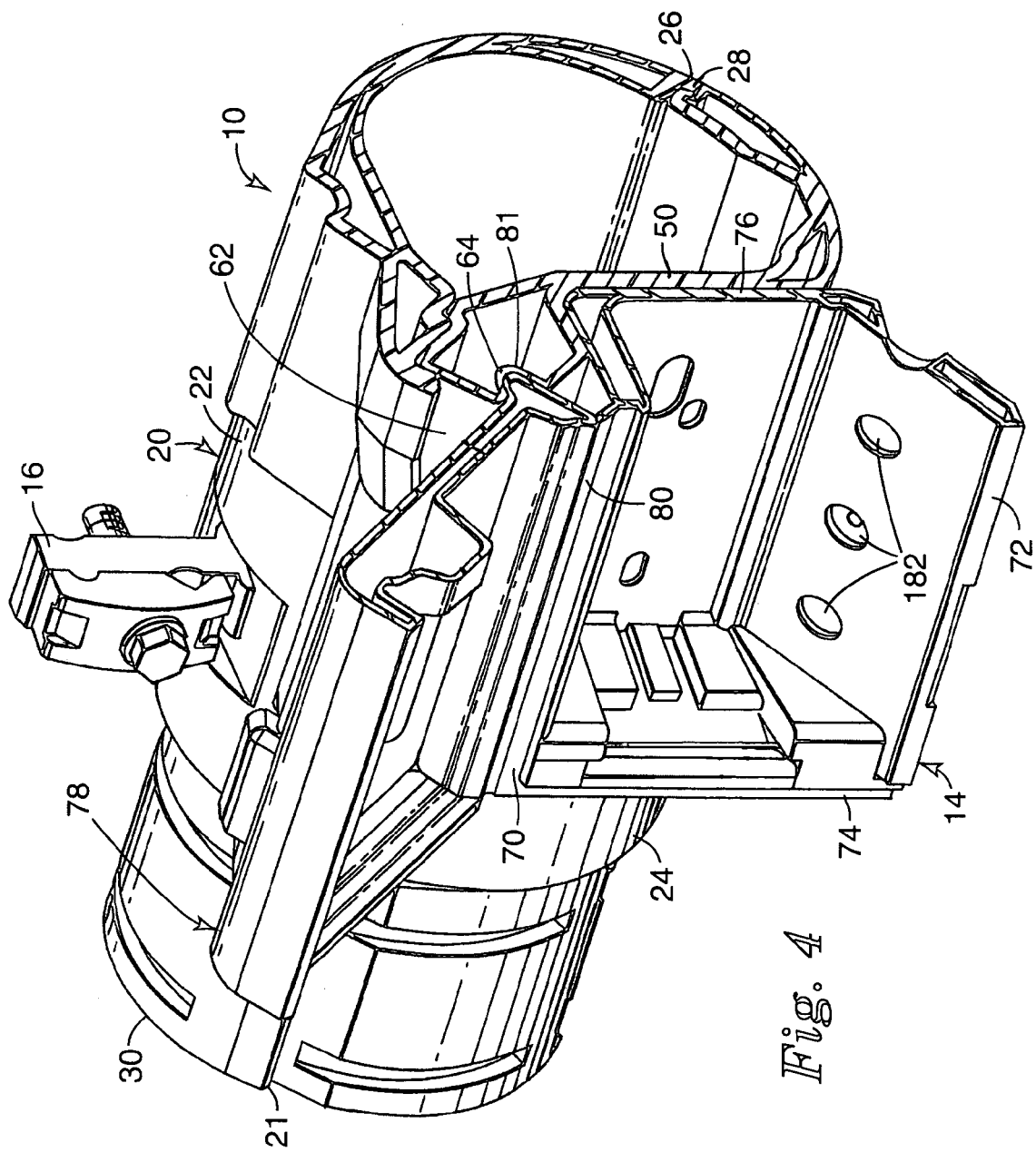
FIG. 4 is a perspective cross-sectional view of the enclosure of FIG. 3.
Figure 5:
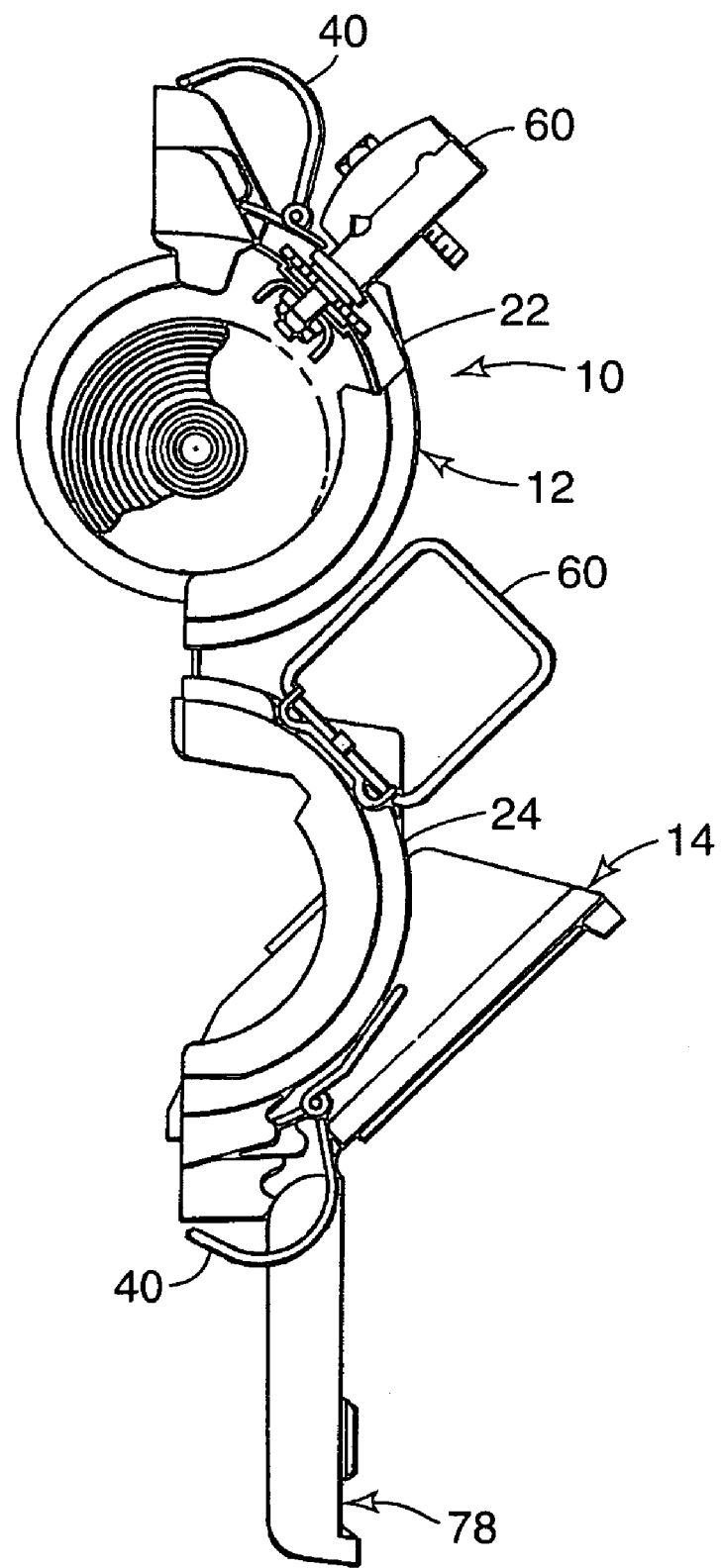
FIG. 5 is an end view of the enclosure in FIG. 2, showing the splice closure in an open position and the terminal closure in an open position.

As will be apparent by examination of FIGS. 1 and 4, access to the enclosed splice area within casing 20 is facilitated by the rotational position of first casing section 22 (in the upper position) relative to second casing section 24 (in the lower position). In particular, first and second sections 22, 24 of casing 20 are oriented such that when casing 20 is opened, a substantially unobstructed view is provided into the splice area inside casing 20 (see FIG. 2). This is accomplished by preferred positioning of hinge line 26 relative to the location of hangers 16. In one embodiment, hinge line 26 is positioned between about 125° to 145°, and preferably about 135°, from attachment points of hangers 16 for mounting the terminal 10 to a support cable (not shown).

In FIG. 2, splice closure 12 is depicted with casing 20 in the open position. End seals 34, which may be formed according U.S. Pat. No. 4,857,672, assigned to assignee of this application and incorporated by reference herein, are supported in recesses in first and second ends 30, 32 of section 22 such that end seals 34, upon receiving a cable therethrough, are retained adjacent first and second ends 30, 32, respectively. End seals 34 are engaged and sealed by cooperating recessed areas at the first and second ends 30, 32 of section 24 when the sections 22, 24 are in the closed position.

Section 24 of casing 20 optionally includes openings 42 which form drains in the lower portion of casing 20. Openings 42 may be screen covered and include filtering means to limit the ingress of dirt, water, bugs, and the like, into casing 20. In embodiments where terminal 10 is a below-grade enclosure, openings 42 are preferably omitted.

Best seen in FIG. 4, section 24 of casing 20 also includes a support surface 50 for joining to and supporting thereon terminal closure 14. Support surface 50 is generally flat, inside and outside of casing 20. Support surface 50 is formed with at least one opening 52 through which telecommunication lines, such as optical fibers or copper wires may pass from splice closure 12 into terminal closure 14. Support surface 50 is positioned on a side of casing 20 below opening seam 21, such that the terminal closure 14 supported thereon is readily accessible from the side or front of terminal 10. Section 24 optionally supports on its outer surfaces a plurality of drop wire strain relief brackets 60 which support drop wires (not shown) entering terminal closure 14.

Terminal closure 14 is joined to casing 20 at the support surface 50 by any suitable means to make splice closure 12 and terminal closure 14 a unitary structure. If splice closure 12 and terminal closure 14 are first formed as separate units, suitable means for making splice closure 12 and terminal closure 14 a unitary structure include, for example, joining splice closure 12 and terminal closure 14 using pop rivets, machine screws, bolts, heat welding, sonic welding, and the like. Splice closure 12 and terminal closure 14 may alternately be joined to form a unitary structure by molding the closures 12, 14 together as a single structure, rather than first forming them as separate units.

The support surface 50 is positioned to place terminal closure 14 on a side of casing 20 when terminal 10 is suspended from a support cable (not shown). Terminal closure 14 comprises a top wall 70, a bottom wall 72, end walls 74, 75, back wall 76 and a lid 78. Lid 78 is hinged to top wall 70 of terminal closure 14 and is preferably hinged by a compression molded hinge 80. That is, hinge 80 is integral with top wall 70 and lid 78 of terminal closure 14. The terminal closure 14 may be molded from a suitable polymer material, such as polyethylene or the like. In this manner, hinge 80 can be readily formed integrally with the walls and lid of terminal closure 14 when molded. Terminal closure 14 may be formed by any conventional molding technique, such as by blow molding, injection molding, and the like.

As best seen in FIG. 4, lid 78 is provided with detents 81 on its outer surface adjacent hinge 80, and the outer wall of casing 20 is provided with projections 62 having concave portions defining recesses 64. Detents 81 cooperate with recesses 64 in casing 20 to maintain lid 78 in an open and raised position when lid 78 is raised sufficiently by, for example, a service technician working on the contents of terminal closure 14. The flexibility of the polymer material forming splice closure 12 and terminal closure 14 is sufficient to permit detent 81 to enter recesses 64 and thereby secure lid 78 in the raised open position. Lid 78 and bottom wall 72 have cooperating latches 82, 84 to hold lid 78 in a closed position.

In use, terminal 10 is used to enclose a telecommunication cable at points where the cable is "spliced into" for distribution of a signal to one or more locations. It should be noted that the phrase "spliced into" as used herein is understood and intended to include any way in which a signal in a telecommunication cable is routed away from the cable for distribution to one or more locations. In practice, the telecommunication cable may be spliced, split, tapped, coupled, and the like. For example, a telecommunication cable may contain a plurality of data lines. At a predetermined point, the cable is spliced into and signals from one or more of the plurality of data lines are routed from the main cable. This may occur, as an example, in a telephone network in which a primary or "trunk" telecommunication cable is routed through an area, and periodically one or more individual data lines are distributed to "branches" of the network. The branches may be further distributed until the network reaches individual homes, businesses, offices, and so on. The distributed lines are often referred to as drop lines or distribution lines.

In the example of a fiber optic telecommunication cable, the cable may contain a plurality of buffer tubes, with each buffer tube containing a plurality of individual optical fibers. At various points along the cable, it may be desired to branch off optical fibers of one or more buffer tubes, but not all of the optical fibers in the cable. The individual optical fibers of a buffer tube may be spliced directly to a corresponding drop line, or the individual optical fibers may be split, such as by using a splitter or coupler, so that the signals in a single fiber are distributed to more than one drop line. At this point, it should be noted that although terminal 10 is described herein primarily as used with fiber optic telecommunication cables, terminal 10 may be used with telecommunication cables in general, including electrically conductive (i.e., copper) cables, and terminal 10 is not limited to use with fiber optic cables. Each type of telecommunication cable has corresponding devices and methods for routing a signal away from the cable to a drop line, and each of those devices and methods are understood and intended to be included in references to "splices" and "splicing into."

As best seen in FIG. 2, a frame 90 is mounted within splice closure 12. Frame 90 is secured within splice enclosure 12 using suitable fastening device such as, for example, pop rivets, machine screws, bolts, and the like. Alternately, frame 90 may be over-molded by splice closure 12, such that other fastening devices are not required to secure frame 90 within splice closure 12. Mounting brackets 92 are provided adjacent first and second ends 30, 32 of splice closure 12 for attachment to a telecommunication cable 116 (shown in FIG. 6). In one embodiment, mounting brackets 92 include strain relief features 94 for attachment to a strength member of the telecommunication cable. In the embodiment illustrated in FIGS. 2 and 6, strain relief features 94 include recessed areas 96 for engaging, for example, a cable clamp or tie securing the telecommunication cable and its strength member.

As noted above, in many applications only a fraction of the plurality of data lines in the telecommunication cable will be spliced into. For ease of use, it is desirable to separate those data lines which are to be spliced into from those data lines which simply pass through terminal 10. Frame 90 includes a retention member 100 for retaining non-spliced data lines of a telecommunication cable away from spliced data lines of a telecommunication cable within the splice closure 12. In particular, retention member 100 maintains spliced lines adjacent a first side 102 of the frame 90 and non-spliced lines adjacent a second side 104 of frame 90 opposite first side 102.

To aid in separating spliced lines from non-spliced lines, frame 90 includes isolation ports 110 for directing the spliced lines to first side 102 of frame 90 and non-spliced lines to second side 104. In the exemplary use of terminal 10 with a fiber optic cable, one or more buffer tubes having therein optical fibers to be spliced or tapped into may be routed through isolation port 110 to first side 102 of frame 90, while other buffer tubes of the cable remain adjacent to the second side 104 of frame 90. Openings 114 are provided in frame 90 adjacent isolation port 110 so that data lines routed through isolation port 110 may be secured to frame 90, such as by cable clamps, cable ties or the like.

Figure 6:
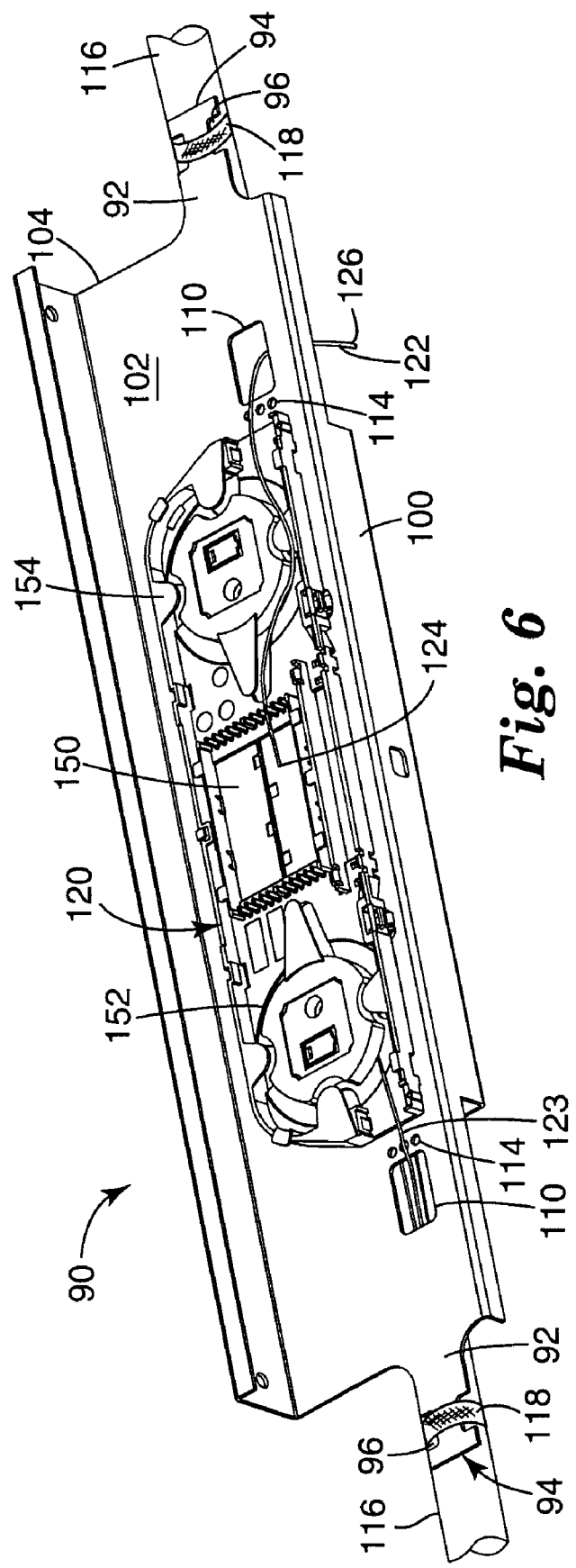
FIG. 6 is a perspective view of a splice closure frame illustrating its use with a fiber optic cable and splice tray.

In FIG. 6, a telecommunication cable 116 is secured to frame 90 using cable clamps 118 (splice closure 12 is not shown). Frame 90 is provided on its first side 102 with a splice tray 120 having communication lines 122 for connection to separated data lines 123 of the telecommunication cable 116. The communication lines 122 may be, for example, a preterminated pigtail ready at a first end 124 for splicing with the separated data lines 123 of telecommunication cable 116 at splice tray 120, and ready at a second end 126 for connection with one or more drop lines (not shown) through openings or cutouts 182 in terminal closure 14. The splice tray 120 may be secured to frame 90 in any suitable manner. In addition to holding the actual splice connections in storage area 150, the splice tray 120 advantageously also provides storage areas 152, 154 for retaining excess lengths of communication lines 122 or data lines 123. In alternate embodiments, communication lines 122 may be omitted, and the separated data lines 123 may be terminated for direct connection with one or more drop lines in terminal closure 14.

Figure 3:
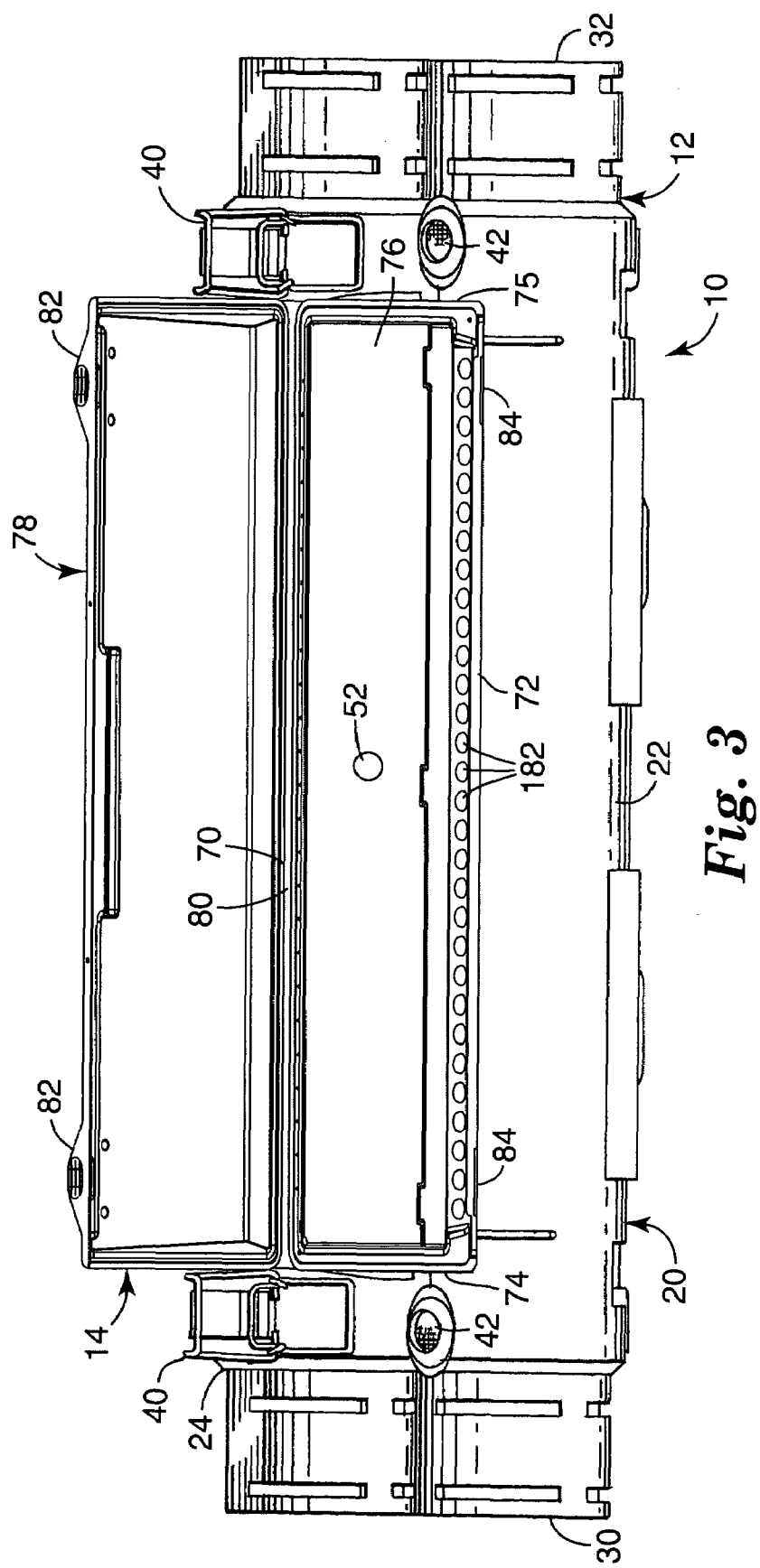
FIG. 3 is a side view of the enclosure of FIG. 1 showing the terminal closure in an open position.

After one or more of the separated data lines 123 of the cable 116 have been spliced into, the communication lines 122 (or alternately data lines 123) are routed through one or more opening 52 into terminal closure 14 (see FIGS. 2 and 3). For clarity of description, the communication lines 122 and data lines 123 within terminal closure 14 will be referred to generally as data lines 123, although it is to be understood that either communication lines 122 or data lines 123, or both, may be present in terminal closure 14.

Within terminal closure 14, the data lines 123 are provided with a connection device 140 for establishing connection with one or more drop lines (not shown) extending outside of the terminal closure 14. In the exemplary use of terminal 10 with a fiber optic cable, a connection device 140 may terminate an individual optical fiber of the cable (either communication lines 122 or data lines 123). Those skilled in the art will recognize that the connection device 140 may be any of a variety of suitable devices, whether a splice, a connector, or other type of connection device. Further, the connection device 140 may be used in combination with couplers, receptacles and other alignment devices used with a splice, connector, or other type of connection device. For example, connection device 140 may be a connector such as a SC, DC, SC-DC, ST, FC, LC, MTP, or MTRJ connector, to name a few, and may be, for example, either a positive contact (PC) or an angled polished connector (APC) type of connector. Connection device 140 may be a splice such as a Fibrlok™ splice available from 3M Company of Saint Paul, Minn., U.S.A. Further, connection device 140 may be used in combination with a coupling device such as the Opti-Tap™ fiber optic receptacle available from Corning Cable Systems of Hickory, N.C., U.S.A. In some embodiments, more than one type of connection device 140 may be used within a single terminal closure 14.

If desired, all of the connection devices 140 in terminal closure 14 may be accessed at the same time by opening the primary opening of terminal closure 14 (i.e., lid 78). Accessing all of the connection devices 140 at the same time may be desired or necessary, for example, during the installation of terminal 10 and the initial splicing of data lines 123 in cable 116. As described above, however, optical fibers and their connection devices are sensitive to their physical handling and the presence of debris such as dust, moisture, and the like. Accordingly, the likelihood of damaging the fibers or the connection devices 140 during reentry into the terminal closure 14 is increased when all of the connection devices 140 and fibers are exposed when the terminal closure 14 is opened. Therefore, the ability to access one or a limited number of optical fiber connection devices 140 in the terminal enclosure 14 without exposing all optical fibers and connection devices 140 in the terminal enclosure 14 is highly desirable.

Figure 7A:
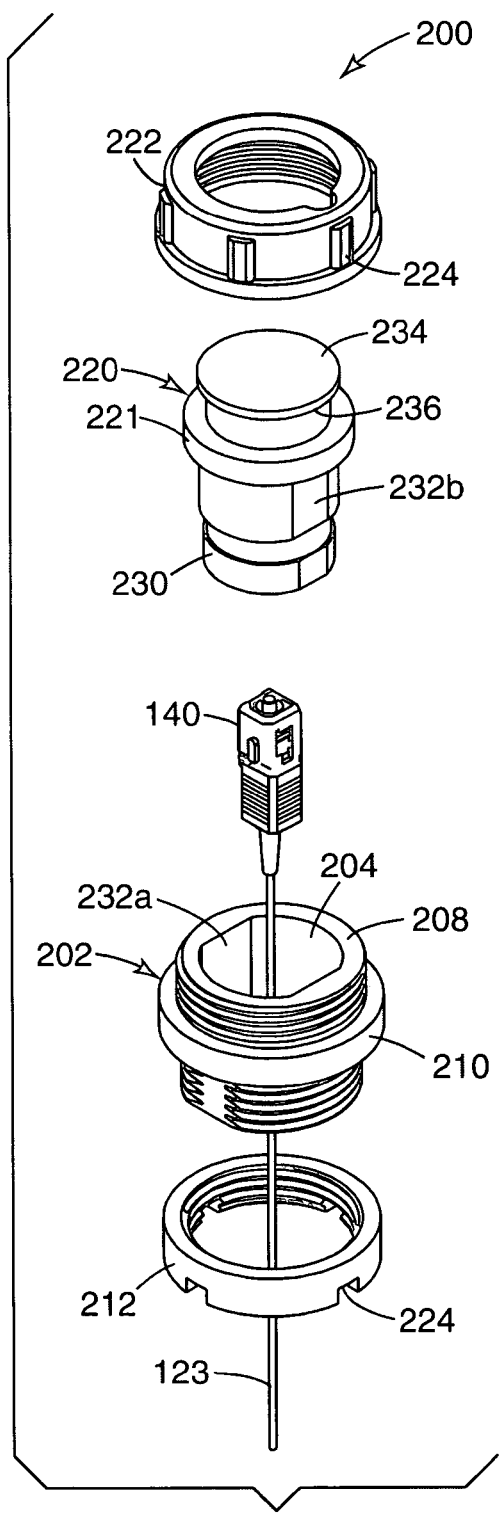
FIGS. 7A and 7B are exploded perspective views of one embodiment of an adaptor for use with the enclosure of FIGS. 1-5, using a connection device coupler in FIG. 7A and using a sealing member in FIG. 7B.
Figure 7B:
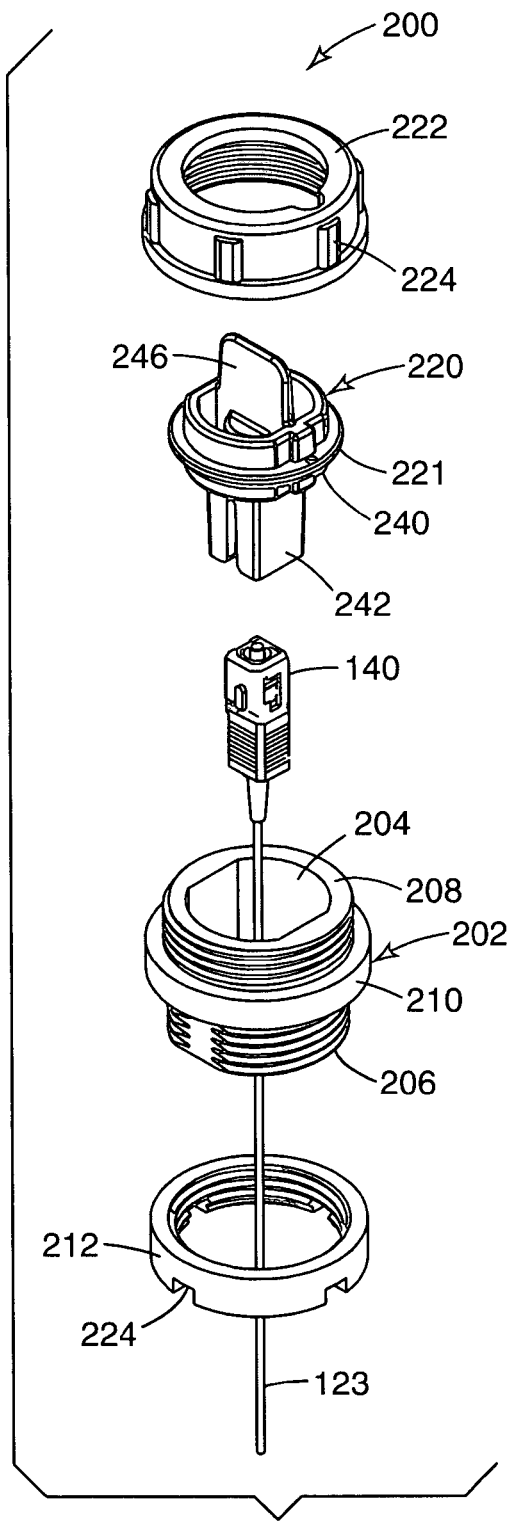

Referring to FIGS. 7A and 7B, an adaptor 200 for allowing a connection device 140 to be withdrawn or extracted from the terminal closure 14 from an exterior of the terminal closure 14 is illustrated. The adaptor 200 includes a body portion 202 having a passageway or port 204 extending therethrough from a first end 206 to a second end 208. The port 204 is sized to receive a connection device 140 therein, and to permit the connection device 140 to pass freely through the length of the port 204. A flange 210 extends laterally outward from the body portion 202. The first end 206 and flange 210 of the body portion 202 are sized such that first end 206 passes through a cutout 182 in wall 72 of terminal housing 14 (FIG. 4), while flange 210 is prevented from passing through the cutout 182. A retainer nut 212 positioned inside the terminal closure 14 (not shown) engages first end 206 and secures body portion 202 within the cutout 182. In another embodiment, illustrated in FIGS. 8A and 8B, body portion 202 is integrally formed with the wall 72 of terminal closure 14, such that flange 210 and retainer nut 212 are unnecessary.

The adaptor 200 further includes a connection device receptacle 220 configured for engaging the connection device 140. The receptacle 220 may be configured to engage a range of connection device types, or may alternately be configured to engage only one connection device type. The connection device receptacle 220 includes a flange 221 for preventing the receptacle 220 from passing completely into port 204 and allowing the receptacle to be removed from the port 204 only from the exterior of terminal closure 14. The receptacle 220 is removably retained within the port 204 by a retainer nut 222 that traps flange 221 against second end 208 of body portion 202. In the illustrated embodiment, the retainer nuts 212, 222 are threadably engaged with the first and second ends 206, 208, respectively, and include gripping portions 224, such as ridges, recesses or flats, on their circumferential surfaces to facilitate the turning of retainer nuts 212, 222 with a tool or by hand. However, other engagement means may also be used, such as snap fitting, retainer rings, retainer pins, and the like.

Figure 8A:
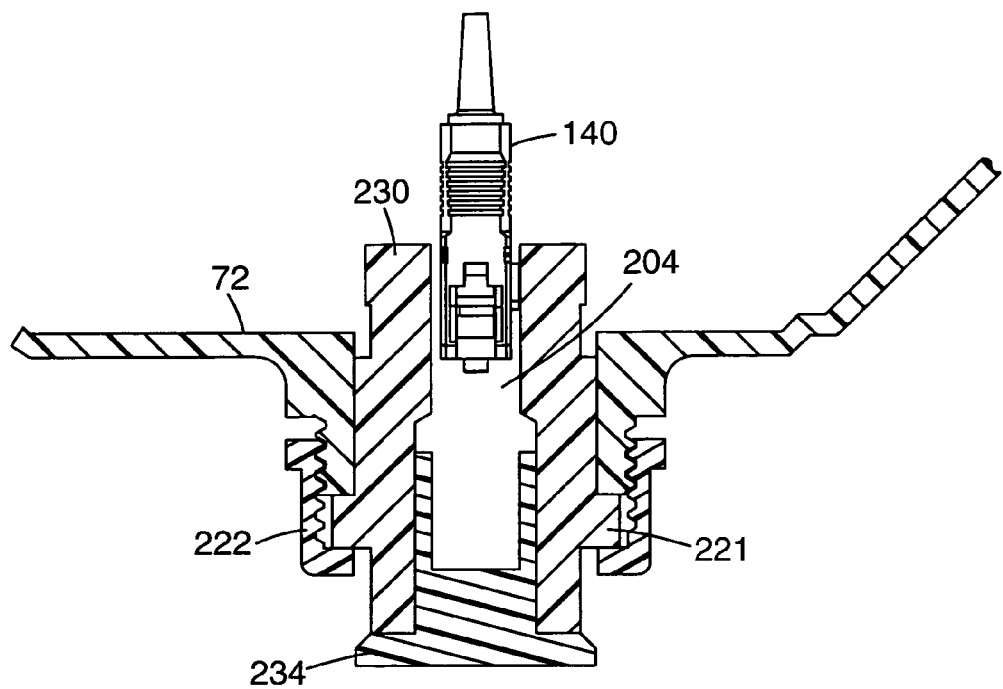
FIGS. 8A and 8B are cross-sectional views of another embodiment of an adaptor for use with the enclosure of FIGS. 1-5, using a connection device coupler in FIG. 8A and using a sealing member in FIG. 8B.

In FIGS. 7A and 8A, the connection device receptacle 220 is a coupler 230 for facilitating the connection of connection device 140 with a mating connection device (not shown) terminating a telecommunication line extending outside of the housing, such as a drop line. Port 204 and coupler 230 are optionally provided with keying means, such as mating flats 232a, 232b, respectively, to ensure the proper orientation of coupler 230 within port 204, or to allow only a predetermined type of coupler 230 to be inserted into port 204. If connection device 140 is not to be immediately connected to a mating connection device, connection device 140 may be parked in the coupler 230 until such time as a mating connection device is provided. A cap 234 is provided to close the coupler 230 when a mating connector is not present, thereby preventing the ingress of moisture, dust, and other contaminants into the adaptor 200 and terminal housing 14. Cap 234 is preferably provided with a circumferential ridge 236 or other gripping means to aid a user in extracting the coupler 230 and (and parked connection device 140) from port 204.

Figure 8B:
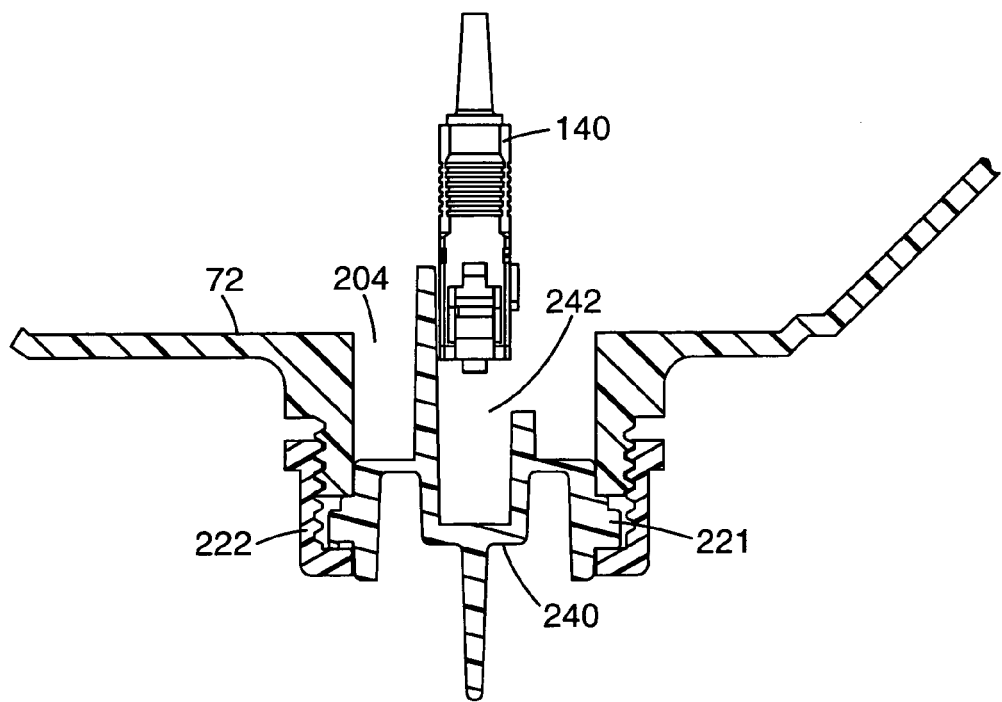

In FIGS. 7B and 8B, the connection device receptacle 220 is a sealing member 240 for preventing the ingress of moisture, dust, and other contaminants into the adaptor 200 and terminal housing 14. Sealing member 240 is provided with a dummy receptacle 242 for parking a connection device 140, if so desired. A tab 246 or other gripping means is provided to aid a user in extracting the sealing member 240 (and parked connection device 140) from port 204. Sealing member 240 is made of any suitable flexible and resilient material, such as rubber or polymer materials including thermoplastic elastomer (TPE) or thermoplastic vulcanate (TPV) types of materials. Preferably, sealing member 240 is made of a material which is UV stable, chemically inert, flexible, tear resistant and moderately compression-set resistant. In an alternate embodiment, when adaptor body portion 202 is not integrally formed with terminal housing 14, the sealing member 240 may be sized to fit directly in a cutout 182 and remain secured therein by the resilient nature of the sealing member material.

When a connection device 140 parked in connection device receptacle 220 is to be connected to a mating connection device (not shown) outside of the housing, it is not necessary to open lid 78 (i.e., the primary opening) of terminal housing 14 to complete the connection. If receptacle 220 is a coupler 230, cap 234 is simply removed and the mating connection device is inserted into the coupler 230 to complete the connection. If it is necessary or desirable to clean or otherwise prepare connection device 140 before completing the connection, retainer nut 222 is removed and coupler 230 is extracted from the port 204 together with the parked connection device 140. Again, it is not necessary that lid 78 of terminal housing 14 to be opened. The parked connection device 140 is disengaged from the coupler 230 for cleaning or other preparation, and then the prepared connection device is reinserted in coupler 230. Coupler 230 is again inserted into port 204, retainer nut 222 is reinstalled to secure coupler 230, and then cap 234 is removed to allow insertion of the mating connection device.

When a connection device 140 is parked in a sealing member 240 and is to be connected to a mating connection device outside of the housing, again it is not necessary to open lid 78 of terminal housing 14 to complete the connection. First, retainer nut 222 is removed and sealing member 240 is extracted from the port 204 together with the parked connection device 140. The parked connection device 140 is disengaged from the sealing member 240 for cleaning or other preparation. The prepared connection device 140 may then be inserted into a coupler 230, and connection to a mating connection device proceeds as described above. Alternately, the prepared connection device 140 may be connected to a mating connection device in some other manner (such as by splicing) and then reinstalled in the port 204 of adaptor 200 with appropriate sealing means preventing the ingress of moisture, dust and insects into the terminal closure 14 through port 204.

Figure 9:
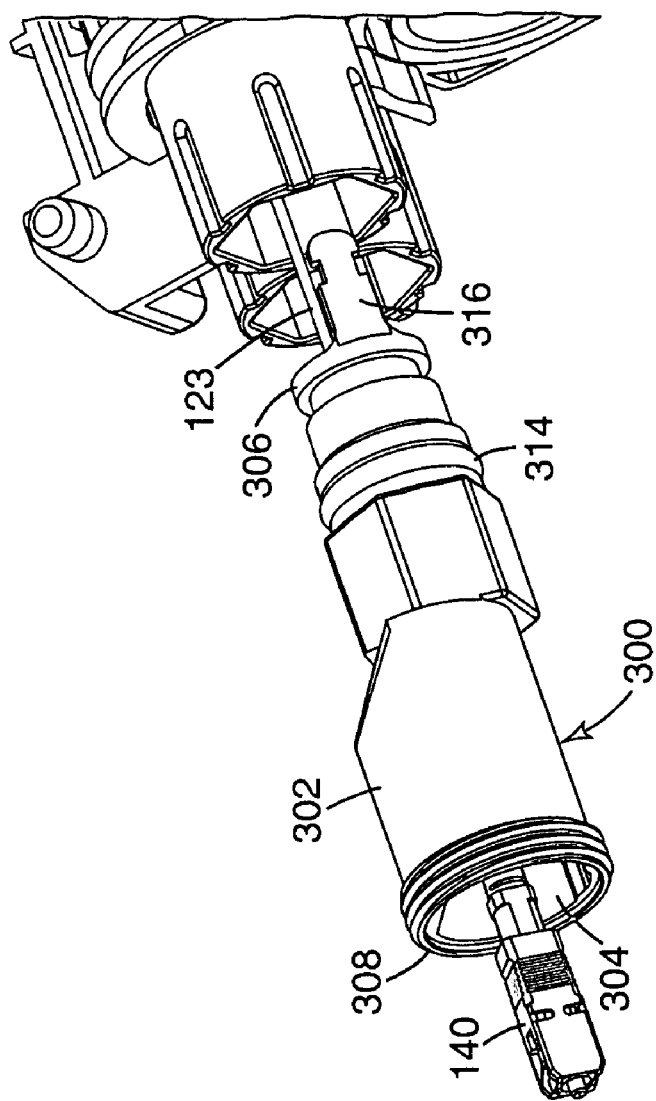
FIG. 9 is an exploded perspective view of another embodiment of an adaptor for use with a telecommunications enclosure according to the invention.
Figure 9:
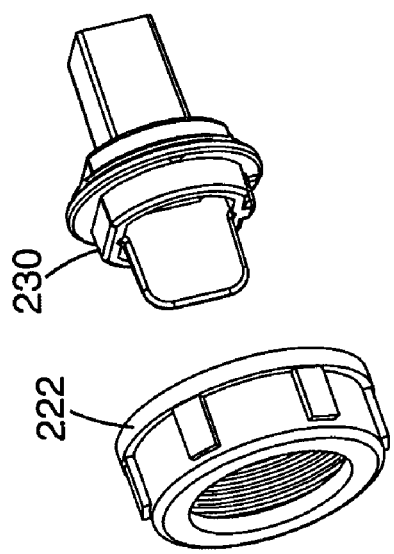

The body portion 202 of adaptor 200 may have embodiments other than those shown in FIGS. 7A-8B. For example, in FIG. 9 an adaptor 300 includes a body portion 302 having a passageway or port 304 extending therethrough from a first end 306 to a second end 308. The port 304 is sized to receive a connection device 140 therein, and to permit the connection device 140 to pass freely through the length of the port 304. First end 306 of body portion 302 is shaped to engage opening 310 in telecommunications enclosure 312 in a snap-fitting manner. A resilient o-ring 314 provides a moisture seal between first end 306 of body portion 302 and enclosure 312. First end 306 is optionally provided with a strain relief feature 316 to which data lines 123 may be secured. Adaptor 300 is used with a coupler 230 (not shown) or a sealing member 240 and retainer nut 222, as described above with respect to FIGS. 7A-8B.

Figure 10A:
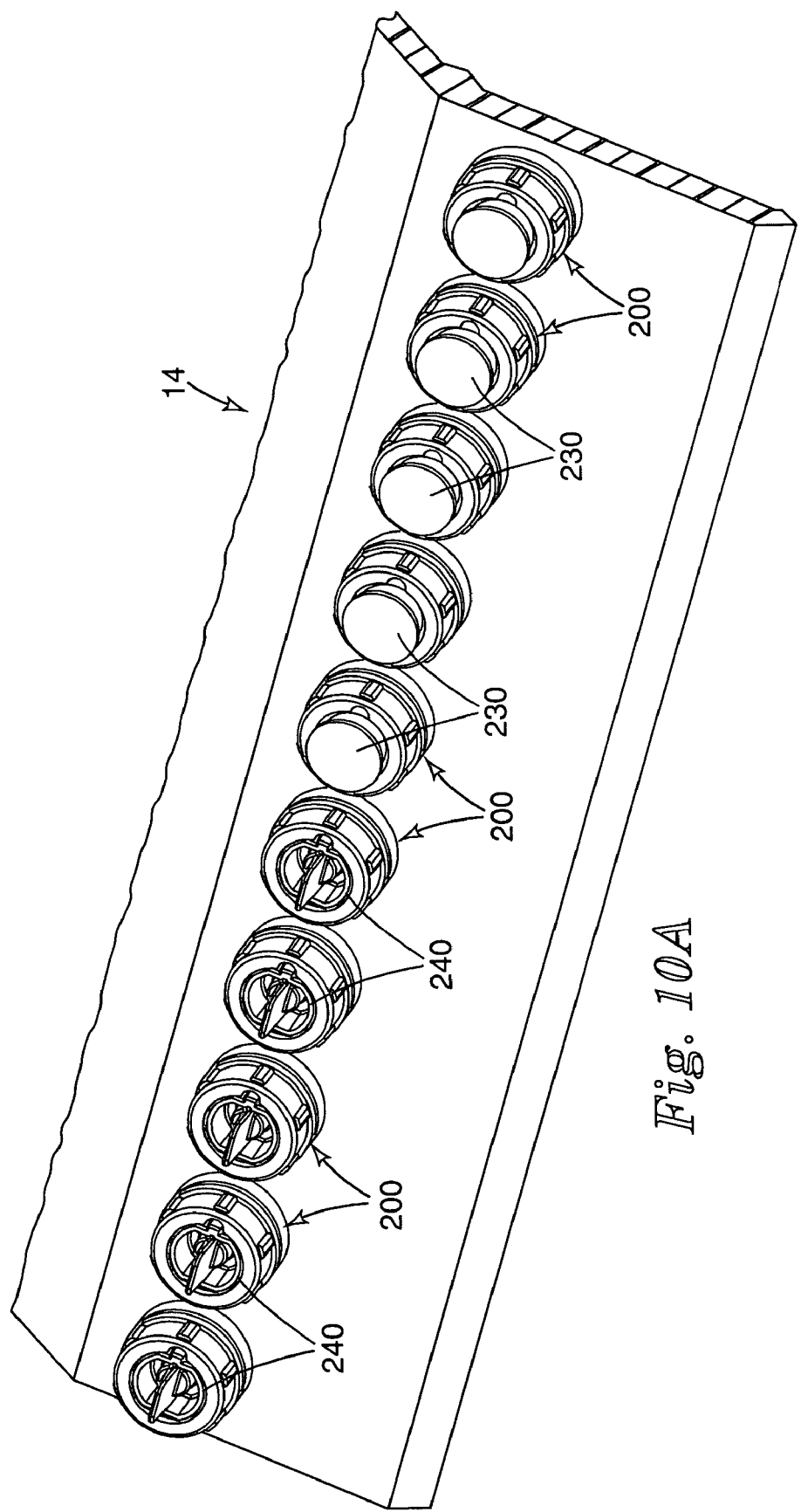
FIG. 10A is a perspective exterior view of an enclosure according to the invention.

FIGS. 10A and 10B illustrate a portion of terminal closure 14 having all of the cutouts 182 populated with adaptors 200. A portion of the adaptors 200 are filled with couplers 230, and another portion of the adaptors 200 are filled with sealing members 240. As best seen in FIG. 10B, each of the couplers 230 and sealing members 240 may be used to park a connection device 140 adjacent the wall of the terminal closure 14, such that the connection device 140 may be extracted through the wall without entering the closure 14 via its primary opening. The connection devices 140 may all be of a single connection device type, or may alternately comprise two or more different connection device types. If the connection devices 140 are of different types, the couplers and sealing members may be configured to engage only one of the different connection device types.

The inventive enclosure has been described herein with reference to an aerial terminal for use with a fiber optic cable having a plurality of optical fibers, where the terminal includes separate splice and terminal closures. In other embodiments according to the invention, the enclosure can comprise any above-grade or below-grade housing, and may be used with optical or electrical telecommunication cables. Further, other embodiments of enclosures according to the invention do need not have separate splice and terminal closures. As illustrated, the connection device receptacles 220 engage a single connection device 140. However, the connection device receptacles 220 may also be configured to engage more than one connection device 140, while otherwise continuing to operate in the manner described.

Although specific embodiments have been illustrated and described herein for purposes of description of the preferred embodiment, it will be appreciated by those of ordinary skill in the art that a wide variety of alternate or equivalent implementations may be substituted for the specific embodiments shown and described without departing from the scope of the present invention. Those with skill in the mechanical, optical, and opto-mechanical arts will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An enclosure for telecommunication lines, the enclosure comprising:
   a splice compartment for retaining splices in telecommunication lines;
   a terminal compartment for retaining telecommunication line connection devices apart from splices retained in the splice compartment;
   at least one port extending through a wall of the enclosure adjacent the terminal compartment, the at least one port configured to receive a connection device and allow extraction of the connection device through the wall from outside the enclosure; and
   a sealing member removably retained in the at least one port, wherein the sealing member includes a receptacle on a first side thereof and a grip on a second side thereof, the receptacle configured to engage the connection device, and the grip configured for grasping by a user for extraction of the sealing member from the port.

2. The enclosure of claim 1, wherein the at least one port and the sealing member are configured to receive one of a plurality of connection device configurations.

3. The enclosure of claim 1, wherein the at least one port and the sealing member are configured to receive two or more connection devices and allow extraction of the two or more connection devices through the wall from outside the enclosure.

4. The enclosure of claim 1, wherein the port is integrally formed with the wall of the enclosure.

5. The enclosure of claim 1, wherein the at least one port is formed in an adaptor, the adaptor releasably secured in a cutout in the wall of the enclosure.

6. The enclosure of claim 1, wherein the terminal compartment is accessible through a primary enclosure opening different from the at least one port, the primary enclosure opening allowing simultaneous access to all connection devices in the terminal compartment.

7. A terminal for a telecommunication cable having a plurality of telecommunication lines, the terminal comprising:
   a splice closure for retaining spliced telecommunication lines of a telecommunication cable;
   a terminal closure joined to the splice closure, the terminal closure configured to retain a plurality of connection devices connected to corresponding telecommunication lines in the splice closure;
   at least one closable port extending through an external wall of the terminal closure, the at least one closable port configured for allowing a connection device to be withdrawn from the terminal closure through the at least one closable port from an exterior of the terminal closure; and a sealing member configured for insertion into the at least one port, wherein the sealing member includes a receptacle on a first side thereof and a grip on a second side thereof, the receptacle configured to engage the connection device, and the grip configured for grasping by a user for extraction of the sealing member and connection device from an exterior of the terminal closure.

8. The terminal of claim 7, wherein the closable port is integrally formed with the external wall of the terminal closure.

9. The terminal of claim 7, wherein the at least one closable port is part of an adaptor body releasably secured in a cutout in the wall of the terminal closure.

10. The terminal of claim 9, further comprising a plurality of cutouts in the wall of the terminal closure, wherein at least one of the plurality of cutouts is closed by the sealing member.

11. The terminal of claim 10, wherein the sealing member is formed of a resilient material.

12. The terminal of claim 10, wherein each of the plurality of cutouts in the wall of the terminal closure is filled by a corresponding adaptors or sealing member.

13. The terminal of claim 7, wherein the telecommunication cable is a fiber optic cable having a plurality of optical fibers.

14. The terminal of claim 7, wherein the telecommunication cable is a copper cable having a plurality of copper strands.

15. The terminal of claim 7, further comprising a hanger secured to the splice closure for suspending the splice closure and terminal closure from a support cable.

* * * * *